US009552961B2

(12) United States Patent
Tromp

(10) Patent No.: US 9,552,961 B2
(45) Date of Patent: Jan. 24, 2017

(54) SCANNING TRANSMISSION ELECTRON MICROSCOPE HAVING MULTIPLE BEAMS AND POST-DETECTION IMAGE CORRECTION

(71) Applicant: International Business Machines Corporation, Armonk, NY (US)

(72) Inventor: Rudolf M. Tromp, North Salem, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/683,679

(22) Filed: Apr. 10, 2015

(65) Prior Publication Data
US 2016/0300689 A1   Oct. 13, 2016

(51) Int. Cl.
*H01J 37/28* (2006.01)
*H01J 37/26* (2006.01)

(52) U.S. Cl.
CPC ...... *H01J 37/263* (2013.01); *H01J 2237/2809* (2013.01); *H01J 2237/2826* (2013.01)

(58) Field of Classification Search
CPC ...... H01J 37/28; H01J 37/222; G01N 23/2251
USPC ............ 250/311, 307, 306, 310, 396 R, 397; 382/219, 255, 276, 278, 291, 293
See application file for complete search history.

(56) References Cited

U.S. PATENT DOCUMENTS

| | | | | | |
|---|---|---|---|---|---|
| 4,618,767 | A | * | 10/1986 | Smith | H01J 37/28 250/306 |
| 4,907,287 | A | * | 3/1990 | Homma | G06T 5/006 250/396 R |
| 5,788,853 | A | * | 8/1998 | Zenhausern | G01N 1/36 216/2 |
| 6,259,960 | B1 | * | 7/2001 | Inokuchi | G01N 21/9501 250/310 |
| 6,768,114 | B2 | * | 7/2004 | Takagi | H01J 37/222 250/306 |
| 6,774,364 | B2 | * | 8/2004 | Takagi | H01J 37/28 250/306 |
| 6,825,480 | B1 | * | 11/2004 | Watanabe | G01R 31/307 250/310 |

(Continued)

OTHER PUBLICATIONS

List of IBM Patents or Patent Applications Treated as Related; Jul. 29, 2015; pp. 1-2.

(Continued)

*Primary Examiner* — David A Vanore
(74) *Attorney, Agent, or Firm* — Cantor Colburn LLP; Vazken Alexanian

(57) ABSTRACT

Embodiments are directed to an information processing system for generating a corrected image of a sample. The system includes a detector, a memory communicatively coupled to the detector, and a post-detection image processor communicatively coupled to the memory and the detector. The detector is configured to detect data of a plurality of moving particles, wherein the data of the plurality of moving particles correspond to an uncorrected image of the sample, and wherein the uncorrected image includes defocus, astigmatism and spherical aberration. The post-detection image processor is configured to generate a corrected image of the sample based at least in part on processing the detected data of the plurality of moving particles.

13 Claims, 12 Drawing Sheets

(56) References Cited

U.S. PATENT DOCUMENTS

| | | | |
|---|---|---|---|
| 7,180,061 B2* | 2/2007 | Lu | G01N 1/32 250/304 |
| 7,224,824 B1 | 5/2007 | Kam et al. | |
| 7,526,143 B2* | 4/2009 | Yamaguchi | G01N 23/2251 358/452 |
| 7,786,450 B2 | 8/2010 | Zach et al. | |
| 7,933,010 B2 | 4/2011 | Rahn et al. | |
| 8,125,518 B2* | 2/2012 | Okai | G01B 15/00 348/80 |
| 8,214,166 B2* | 7/2012 | Tanaka | H01J 37/222 438/14 |
| 8,253,099 B2* | 8/2012 | Nicolopoulos | G01N 23/20058 250/307 |
| 8,586,923 B1* | 11/2013 | Tromp | G01N 23/2251 250/306 |
| 8,642,959 B2 | 2/2014 | Wang | |
| 9,057,670 B2* | 6/2015 | Demarest | G01N 1/28 |
| 2002/0065900 A1* | 5/2002 | Dor | H01L 22/20 709/217 |
| 2002/0099573 A1* | 7/2002 | Koguchi | G06Q 10/10 705/3 |
| 2003/0193024 A1* | 10/2003 | Takagi | H01J 37/28 250/310 |
| 2004/0122790 A1* | 6/2004 | Walker | G06F 19/321 |
| 2005/0045819 A1* | 3/2005 | Bedell | G01N 23/04 250/307 |
| 2006/0065830 A1* | 3/2006 | Bauer | G01N 1/32 250/307 |
| 2006/0097167 A1* | 5/2006 | Domenicucci | G03H 5/00 250/311 |
| 2006/0187719 A1* | 8/2006 | Matsumoto | H01L 23/544 365/189.07 |
| 2006/0284088 A1 | 12/2006 | Fukunaga et al. | |
| 2009/0283676 A1* | 11/2009 | Skoglund | G01N 23/046 250/307 |
| 2013/0043386 A1* | 2/2013 | Yamazaki | H01J 37/28 250/307 |
| 2013/0126729 A1* | 5/2013 | Own | H01J 37/261 250/307 |
| 2015/0074523 A1* | 3/2015 | Konishi | H01J 37/28 715/705 |

OTHER PUBLICATIONS

Rudolf M. Tromp, "Scanning Transmission Electron Microscope Having Multiple Beams and Post-Detection Image Correction" U.S. Appl. No. 14/745,634, filed Jun. 22, 2015.

Hetherington et al., "High-resolution TEM and the application of direct and indirect aberration correction," Microscopy and Microanalysis, vol. 14, No. 01, 2008, pp. 60-67.

* cited by examiner

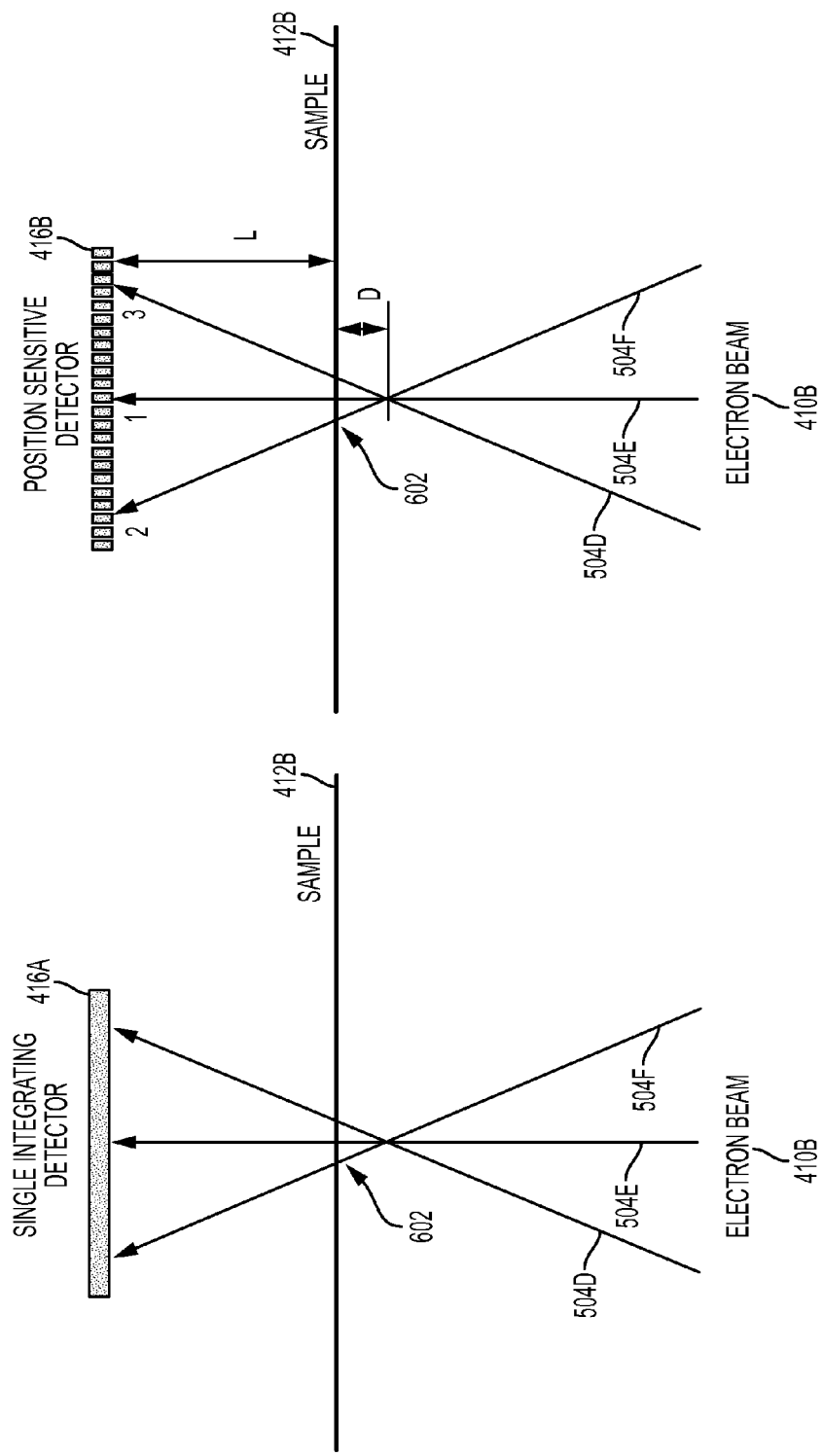

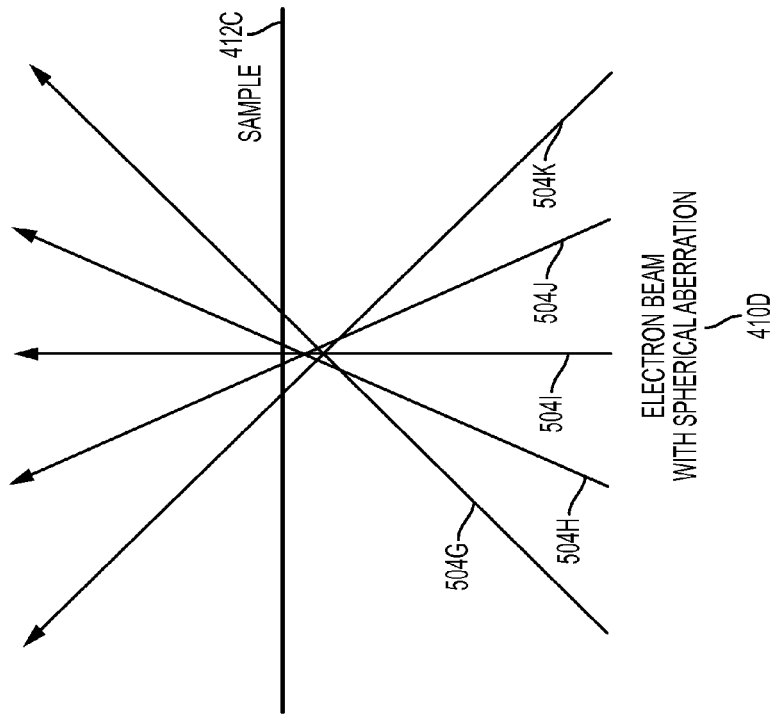
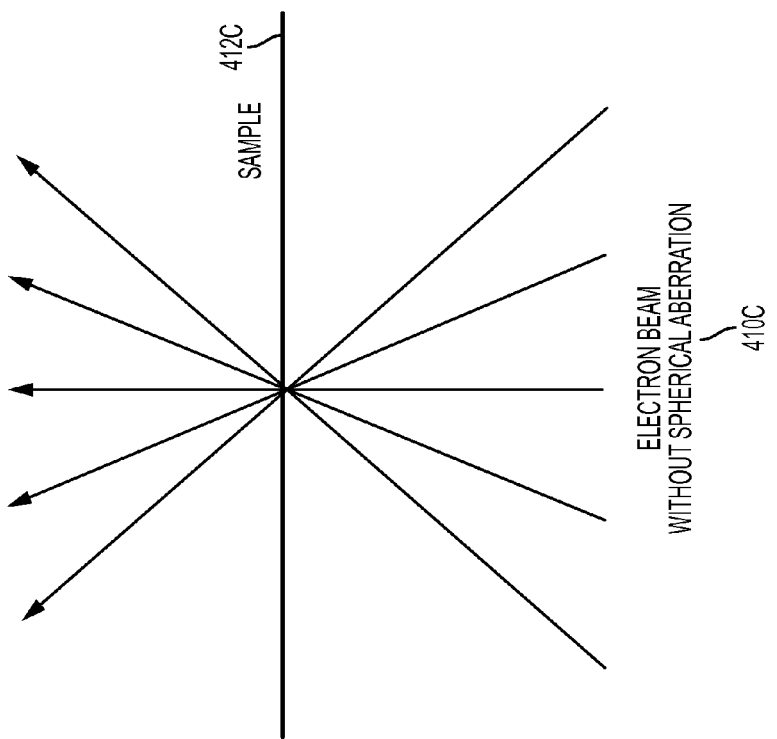

$$S_x = C_{10}g_x + C_{12a}g_x + C_{12b}g_y + C_{30}(g_x^3 + g_x g_y^2)$$
$$S_y = C_{10}g_y - C_{12a}g_y + C_{12b}g_x + C_{30}(g_y^3 + g_x^2 g_y)$$
EQUATION (1)

$$S_x^D = (d+l)g_x + C_{12a}g_x + C_{12b}g_y + C_{30}(g_x^3 + g_x g_y^2)$$
$$S_y^D = (d+l)g_y - C_{12a}g_y + C_{12b}g_x + C_{30}(g_y^3 + g_x^2 g_y)$$
EQUATION (2)

$$S_x^O = dg_x + C_{12a}g_x + C_{12b}g_y + C_{30}(g_x^3 + g_x g_y^2)$$
$$S_y^O = dg_y - C_{12a}g_y + C_{12b}g_x + C_{30}(g_y^3 + g_x^2 g_y)$$
EQUATION (3)

FIG. 10

SCANNING TRANSMISSION ELECTRON MICROSCOPE HAVING MULTIPLE BEAMS AND POST-DETECTION IMAGE CORRECTION

The present disclosure relates in general to the generation of high resolution images in microscopy. More specifically, the present disclosure relates to systems and methodologies for correcting errors in an image that has been detected by an electron microscope.

Unlike light microscopes, electron microscopes visualize objects using a thin beam of rapidly moving electrons that interact with a sample. Because the wavelength of an electron can be up to 100,000 times shorter than that of visible light photons, the electron microscope has a higher resolving power than a light microscope and can reveal the structure of smaller objects. For example, a transmission electron microscope can achieve better than 0.50 angstroms of resolution, as well as magnifications of up to about 10,000,000 times. In contrast, a typical light microscope is limited by diffraction to about 200 nanometers of resolution and useful magnifications below 2000 times.

In a conventional electron microscope configuration, the electrons are emitted by an electron source. As the electrons move from the electron source through a high vacuum chamber, the electrons are focused into a beam and maintained by a series of electromagnetic lenses. The electrons in the beam encounter the sample and are either absorbed by, scattered by or passed through the sample. Because different regions of the sample are variously transparent to electrons, different amounts of electrons with changed energies and/or phases pass through these regions. Electrons that have encountered the sample are collected by detectors, which in effect capture an image of the sample.

In order for existing microscopes to operate successfully, the illumination that forms the image must be carefully controlled. For existing electron microscopes, in addition to maintaining focus, the electron beam typically must also be managed in order to correct astigmatism and spherical aberration errors that may be introduced prior to image capture and detection. Managing the beam to maintain focus and correct astigmatism and spherical aberration errors prior to image detection typically requires periodic human intervention to manually adjust the electron microscope, along with potentially expensive additional hardware and/or software functionality provided within the microscope.

SUMMARY

Embodiments are directed to an information processing system for generating a corrected image of a sample. The system includes a detector, a memory communicatively coupled to the detector, and a post-detection image processor communicatively coupled to the memory and the detector. The detector is configured to detect data of a plurality of moving particles, wherein the data of the plurality of moving particles correspond to an uncorrected image of the sample, and wherein the uncorrected image includes defocus, astigmatism and spherical aberration. The post-detection image processor is configured to generate a corrected image of the sample based at least in part on processing the detected data of the plurality of moving particles.

Embodiments are further directed to an information processing system for generating a corrected image of a sample. The system includes a detector, a memory communicatively coupled to the detector, and a post-detection image processor communicatively coupled to the memory and the detector. The system is configured to perform a method that includes detecting, by the detector, data of a plurality of moving particles, wherein the data of the plurality of moving particles correspond to an uncorrected image of the sample, and wherein the uncorrected image includes defocus, astigmatism and spherical aberration. The method further includes generating, by the post-detection image processor, a corrected image of the sample based at least in part on processing the detected data of the plurality of moving particles.

Embodiments are further directed to a computer program product for generating a corrected image of a sample. The computer program product includes a non-transitory computer readable storage medium having program instructions embodied therewith, wherein the program instructions are readable by at least one processor circuit to cause the at least one processor circuit to perform a method. The method includes receiving data of a plurality of moving particles, wherein the data of the plurality of moving particles correspond to an uncorrected image of the sample, and wherein the uncorrected image of the sample includes defocus, astigmatism and spherical aberration. The method further includes generating a corrected image of the sample based at least in part on processing the detected data of the plurality of moving particles.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

FIG. 6A depicts a simplified diagram illustrating a slightly defocused beam using a single integrating detector;

FIG. 6B depicts a simplified diagram illustrating a slightly defocused beam using a position sensitive detector;

FIG. 7A depicts a simplified diagram illustrating the focusing of an electron beam without spherical aberration;

FIG. 7B depicts a simplified diagram illustrating the focusing of an electron beam with spherical aberration;

FIG. 10 depicts equations that may be used in correcting an image for defocus, astigmatism and spherical aberration according to one or more embodiments;

Figure 1:
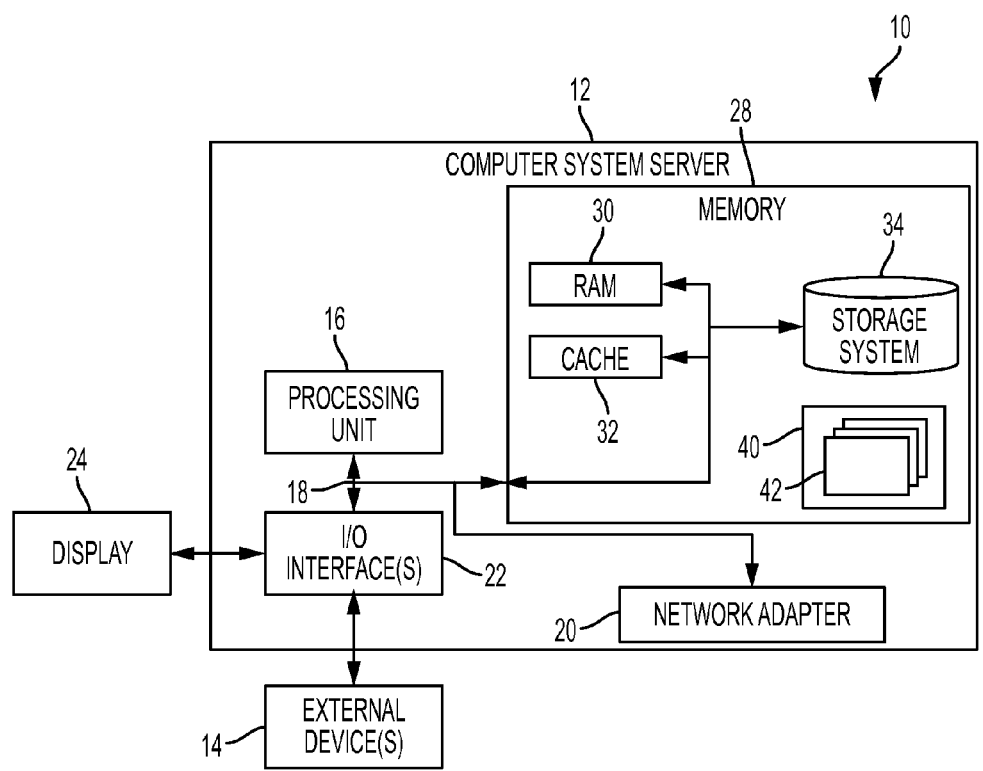
FIG. 1 depicts a cloud computing node according to one or more embodiments.

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Various embodiments of the present disclosure will now be described with reference to the related drawings. Alternate embodiments may be devised without departing from the scope of this disclosure. It is noted that various connections are set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

It is understood in advance that although this disclosure includes a detailed description on cloud computing, implementation of the teachings recited herein are not limited to a cloud computing environment. Rather, embodiments of the present disclosure are capable of being implemented in conjunction with any networked or other type of computing environment now known or later developed. Additionally, although the present disclosure includes embodiments directed to transmission electron microscopy, implementation of the teachings recited herein may apply to other types of microscopy as well, including light based microscopy as long as there is a need to correct image resolution defects including but not limited to defocus, astigmatism and/or spherical aberration.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows: Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
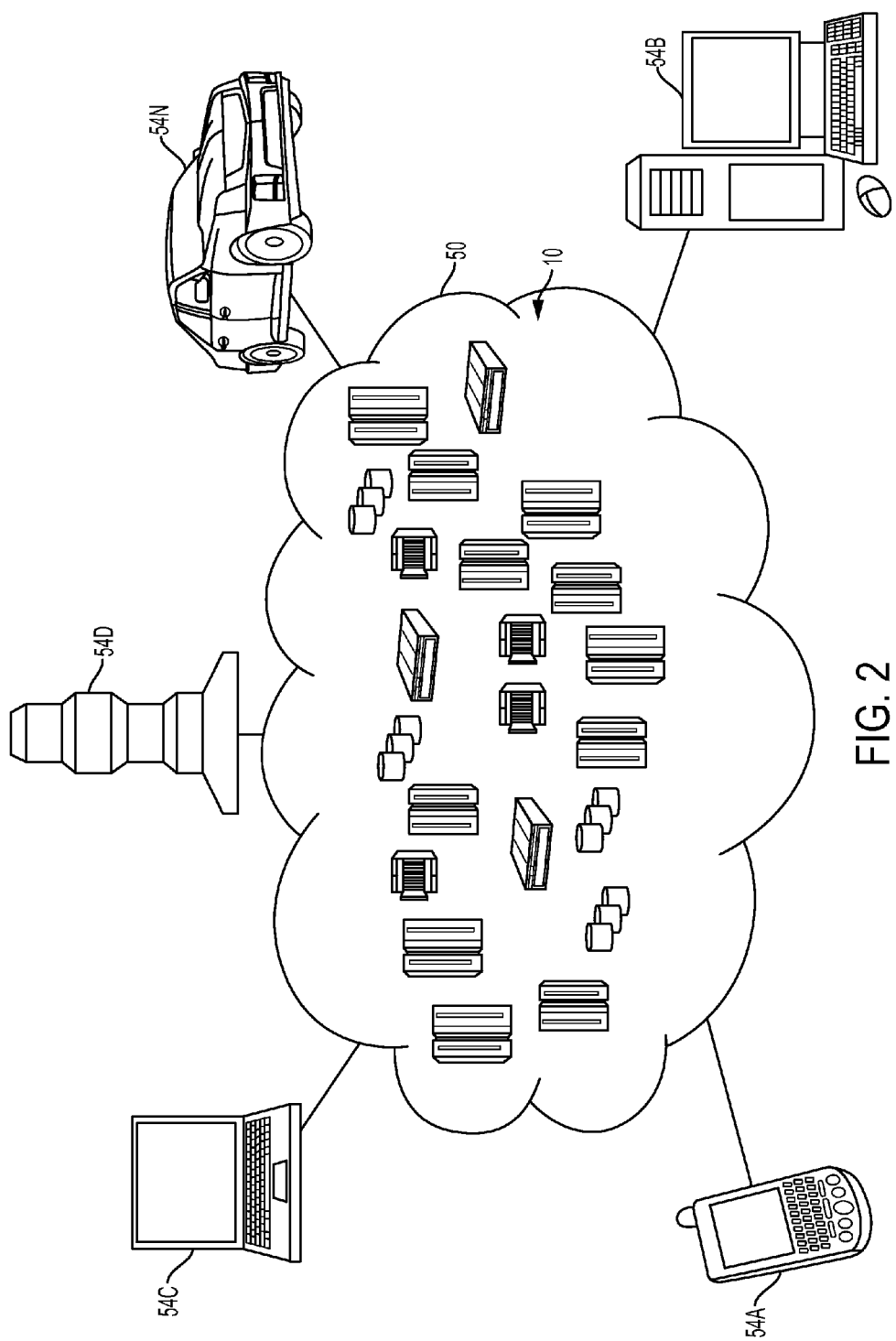
FIG. 2 depicts a cloud computing environment according to one or more embodiments.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, electron microscope system 54D, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
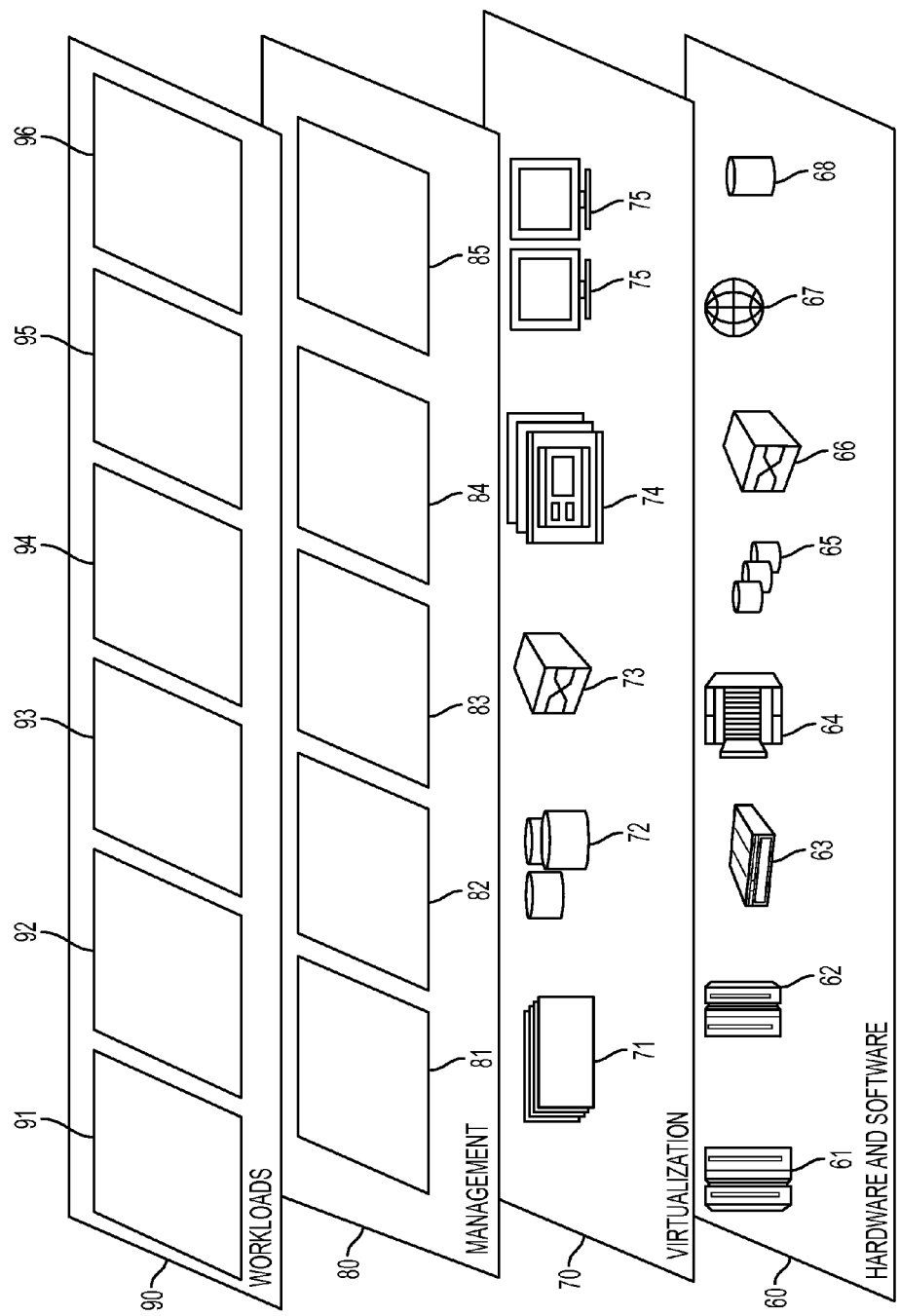
FIG. 3 depicts abstraction model layers according to one or more embodiments.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and a module 96 for supporting post-detection image correction according to one or more embodiments of the present disclosure.

Turning now to a more detailed description of the background technology of the present disclosure, as previously noted herein, an electron microscope is a microscope that uses accelerated electrons as a source of illumination. Because the wavelength of an electron can be up to 100,000 times shorter than that of visible light photons, the electron microscope has a higher resolving power than a light microscope and can reveal the structure of smaller objects. For example, a transmission electron microscope can achieve better than 0.50 angstroms of resolution, as well as magnifications of up to about 10,000,000 times. In contrast, a typical light microscope is limited by diffraction to about 200 nanometers of resolution and useful magnifications below 2000 times. A typical configuration of an electron microscope includes electrostatic and/or electromagnetic lenses to control the electron beam and focus it to form an image. Modern electron microscopes produce electron micrographs, using specialized digital cameras or frame grabbers to capture the image. The electron optical lenses are analogous to the glass lenses of an optical light microscope. Electron microscopes are used to investigate the ultra-structure of a wide range of biological and inorganic specimens including microorganisms, cells, large molecules, biopsy samples, metals and crystals. Industrially, electron microscopes are often used for quality control and failure analysis.

The original form of electron microscope, the transmission electron microscope (TEM) uses a high voltage electron beam to create an image. The electron beam is produced by an electron gun, often fitted with a tungsten filament cathode as the electron source. The electron beam is accelerated by an anode typically at +100 keV (40 to 400 keV) with respect to the cathode, focused by electrostatic and electromagnetic lenses, and transmitted through the specimen that is in part transparent to electrons and in part scatters them out of the beam. When it emerges from the specimen, the electron beam carries information about the structure of the specimen that is magnified by the objective lens system of the microscope. The spatial variation in this information (the "image") may be viewed by projecting the magnified electron image onto a fluorescent viewing screen coated with a phosphor or scintillator material such as zinc sulfide. Alternatively, the image can be photographically recorded by exposing a photographic film or plate directly to the electron beam, or a high-resolution phosphor may be coupled by means of a lens optical system or a fiber optic light-guide to the sensor of a CCD (charge-coupled device) camera, or the image may be recorded by direct detection of the electrons by a CCD or CMOS camera positioned inside the electron microscope vacuum system. The image detected by the CCD or CMOS camera may be displayed on a monitor or computer.

A scanning electron microscope (SEM) is a type of electron microscope that produces images of a sample by scanning it with a focused beam of electrons. The electrons interact with atoms in the sample, producing various signals that can be detected and that contain information about the sample's surface topography and composition. The electron beam is generally scanned in a raster scan pattern, and the beam's position is combined with the detected signal to produce an image. SEM can achieve resolution better than 1 nanometer. Specimens can be observed in high vacuum, in low vacuum, in dry conditions (in environmental SEM), and at a wide range of cryogenic or elevated temperatures.

A common mode of detection in an SEM is by secondary electrons emitted by atoms excited by the electron beam. By scanning the sample and detecting the secondary electrons, an image displaying the topography or other spatial variations of the surface (such as compositional variations) is created. The resolution is limited by the microscope's ability to bring the electron beam to a fine focus, which may be limited by defocus, astigmatism, and spherical aberration, as well as mechanical and electronic instabilities in the microscope system.

A scanning transmission electron microscope (STEM) combines the operating principles of TEMs and SEMs. As with any transmission illumination scheme, the electrons pass through a sufficiently thin specimen. However, STEM is distinguished from conventional TEM by focusing the electron beam into a narrow spot which is scanned over the sample in a raster. The raster scanning of the beam across the sample makes these microscopes suitable for analysis techniques such as mapping by energy dispersive X-ray (EDX) spectroscopy, electron energy loss spectroscopy (EELS) and annular dark-field imaging (ADF). These signals can be obtained simultaneously, allowing direct correlation of image and quantitative spectroscopic data.

By using a STEM and a high-angle detector, it is possible to form atomic resolution images where the contrast is directly related to the atomic number (z-contrast image). The directly interpretable z-contrast image is an appealing feature of STEM imaging with a high-angle detector. This is in contrast to the conventional high resolution electron microscopy technique, which uses phase-contrast, and therefore often produces results which require interpretation by comparison with image simulations. Usually a STEM is a conventional transmission electron microscope equipped with additional scanning coils, detectors and needed circuitry. However, dedicated STEMs are also manufactured.

In order for any microscope to successfully capture a high resolution image, the image forming system, comprising illumination optics, objective lens, and post-specimen lenses including projection lenses, as well as steering and correction optics, must be carefully aligned, adjusted, and focused. For known electron microscopes, in addition to maintaining focus, capturing a high resolution image also requires that the electron beam is controlled throughout multiple iterations to correct astigmatism and spherical aberration errors that may be introduced prior to image detection and capture. Controlling the beam to maintain focus and correct astigmatism and spherical aberration errors prior to image detection typically requires periodic human intervention to adjust the electron microscope, along with potentially expensive additional hardware and/or software functionality provided within the microscope itself.

The present disclosure relates in general to the generation of high resolution images in electron microscopy. As used in the present disclosure, a high resolution image is an image wherein selected defects (e.g., defocus, astigmatism or spherical aberration) are not present. In the present disclosure, the terms uncorrected image refer to an image for which the selected errors are present, and the terms corrected image refer to an image for which the selected errors are not present. The present disclosure further relates to systems and methodologies for correcting selected errors in an image obtained through electron microscopy. The selected errors that may be present in the detected, uncorrected image include but are not limited to defocus, astigmatism and spherical aberration. According to one or more embodiments, a focused electron beam illuminates a small spot on a sample. The spot may be one pixel in the final image. The image is acquired one pixel at a time by scanning either the electron beam or the sample. In known STEM instruments the signal used to construct the image consists of all or some selected part of the electrons transmitted by the sample. The detector integrates over some range of azimuth and polar angle. In the system disclosed herein, the electron beam is focused in a plane that is close to the image plane, but defocused from the exact image plane such that the observed image contains both real-space and angular-space information. By acquiring real-space and angular-space information for each image pixel, the uncorrected image can be corrected, post-detection (i.e., after data collection has been completed), for defocus, astigmatism, and spherical aberration. Significantly, the final image resolution can be better than the profile of the illuminating electron beam, broadened by defocus, astigmatism, and spherical aberration.

In one or more embodiments, the post-detection correction systems and methodologies of the present disclosure may be applied to an array of electron beams incident on the sample. For each electron beam the detector acquires an "N" by "M" (N×M) image, which is a matrix with N rows and M columns. For each pixel in this N×M matrix, the image intensity is measured. Each electron beam will suffer from errors, including but not limited to defocus, astigmatism, and spherical aberration, thereby collecting an uncorrected image on the detector for each electron beam. Using the post-detection correction systems and methodologies of the present disclosure, the uncorrected image obtained with each electron beam is corrected to obtain an image corrected for defocus, astigmatism and spherical aberration. The final corrected image, constructed from all the uncorrected images obtained with the electron beam array, is assembled from the corrected images obtained for each electron beam.

It is noted that, although the present disclosure includes embodiments directed to transmission electron microscopy, implementation of the teachings recited herein may apply to other types of microscopy as well, including light based microscopy as long as there is a need to correct image resolution defects including but not limited to defocus, astigmatism and/or spherical aberration.

Figure 4:
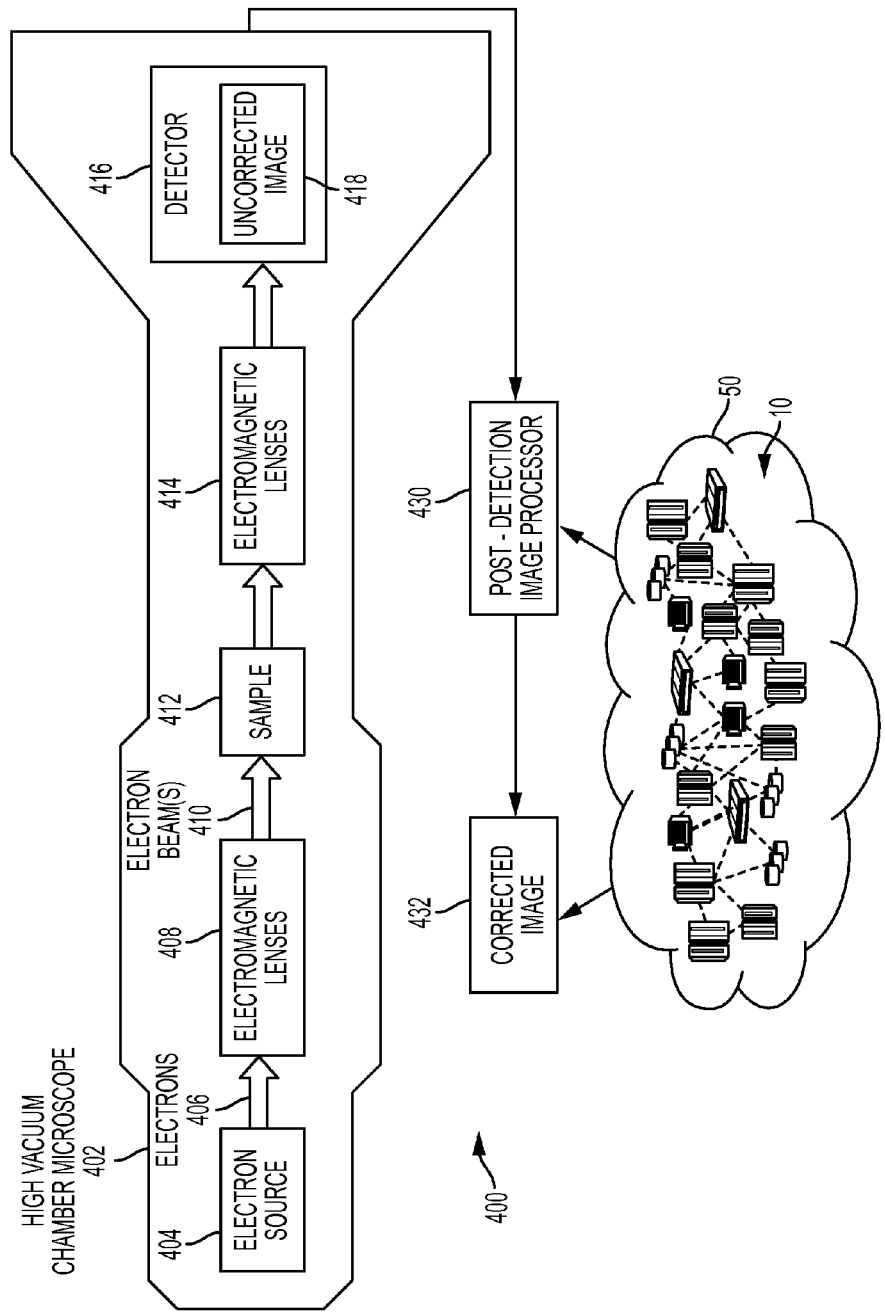
FIG. 4 depicts a simplified diagram illustrating a system according to one or more embodiments.

Turning now to the drawings in greater detail, wherein like reference numerals indicate like elements, FIG. 4 depicts a diagram illustrating a system 400 according to one or more embodiments. System 400 includes a microscope 402, a post-detection processor 430, a corrected image 432 and cloud 50 (also shown in FIG. 2), configured and arranged as shown. Microscope 402 may be implemented as a high vacuum chamber electron microscope that includes an electron source 404, electrons 406, a first set of electrostatic and/or electromagnetic focusing lenses 408, electron beam(s) 410, a sample 412, a second set of electrostatic and/or electromagnetic focusing lenses 414 and a detector 416, configured and arranged as shown. Detector 416 is configured to detect the moving particles that form electron beam(s) 410 and generate data of the moving particles. An uncorrected image 418 may be derived from data of the moving particles. Electron microscope 402 may operate in a variety of modes, including but not limited to TEM, SEM or STEM modes. Cloud 50 may supplement, support or replace some or all of the functionality of post-detection image processor 430 and corrected image 432. Additionally, some or all of the functionality of post-detection image processor 430 and corrected image 432 may be implemented as a node 10 (shown in FIGS. 1 and 2) of cloud 50. Cloud 50 is one example of a networked computing environment that may be used to implement one or more embodiments of the present disclosure. As previously noted herein, it is understood that although this disclosure includes a detailed description on cloud computing, implementation of the teachings recited herein are not limited to a cloud computing environment. Rather, embodiments of the present disclosure are capable of being implemented in conjunction with any networked or other type of computing environment now known or later developed. Additionally, although source 404 generates electrons, for configurations wherein the teachings of the present disclosure are applied to a light-based microscope, the electrons may be any other moving particle capable of being utilized to generate images of a sample.

In operation, electron microscope 402 is housed in a high vacuum chamber. Electrons 406 are emitted by electron source 404, and, as emitted electrons 406 move from electron source 404 through electron microscope 402, the electrons are focused into one or more beams 410 and maintained by first set of electrostatic and/or electromagnetic lenses 408. The electrons in beam 410 encounter sample 412 and are either absorbed by, scattered by or passed through sample 412. Because different regions of sample 412 are variously transparent to electrons, different amounts of electrons pass through these regions. Electrons that have encountered sample 412 are collected by detector 416, which in effect captures uncorrected image 418 of sample 412. Post-detection image processor 430 receives data of uncorrected image 418 and processes it to correct uncorrected image 418 for beam error parameters, including but not limited to defocus, astigmatism and spherical aberration. Post-detection image processor 430 outputs corrected image 432, which is uncorrected image 418 that has been corrected by post-detection image processor 430 for beam error parameters, including but not limited to defocus, astigmatism and spherical aberration. As previously noted herein, cloud 50 may supplement, support or replace some or all of the functionality of post-detection processor 430 and corrected image 432. Additionally, some or all of the functionality of post-detection processor 430 and corrected image 432 may be implemented as a node 10 (shown in FIGS. 1 and 2) of cloud 50.

Figure 5:
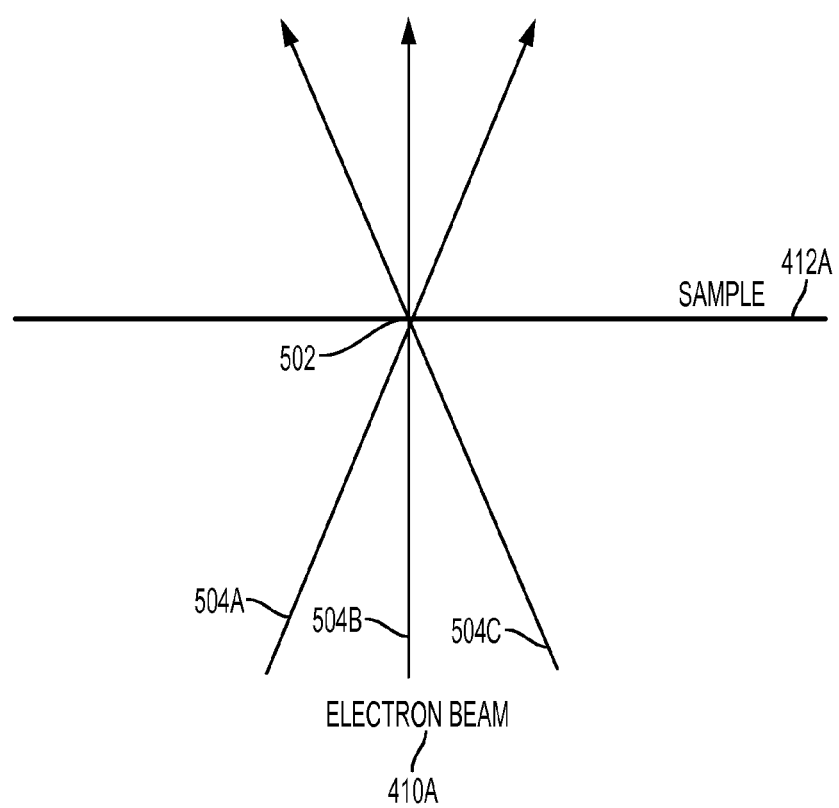
FIG. 5 depicts a simplified diagram illustrating a focused electron beam illuminating a transparent sample.

Turning now to a more detailed description of the principles of operation of one or more embodiments of the present disclosure, FIG. 5 depicts a simplified diagram illustrating a plurality of electrons that have been accelerated to travel in patterns, which are represented diagrammatically as a plurality of rays 504A, 504B, 504C that form an electron beam 410A. The electron beam 410A is focused to a point 502 on a transparent sample 412A. Three rays 504A, 504B, 504C are shown in FIG. 5 for ease of illustration, however, it is understood that any number of rays, as well as any pattern (other than rays) of accelerated electron travel may be used without departing from the scope of the present disclosure. If electron beam 410A is perfectly focused on point 502, the electrons that pass through point 502 of sample 412A may be collected one pixel at a time by a raster scan method, thereby forming a high resolution image (not shown) of sample 412A.

FIG. 6A depicts a simplified diagram illustrating a slightly defocused electron beam 410B (having rays 504D, 504E, 540F) passing through a sample 412B to a single integrating detector 416A. As shown in FIG. 6A, electron beam 410B is focused below sample 412B such that an area 602 of sample 412B is illuminated by electron beam 410B. If electron beam 410B is focused below sample 412B as shown in FIG. 6A, the electrons that pass through sample 412B pass through area 602 of sample 412A. Thus, the information received at integrating detector 416A is averaged over area 602, which causes a loss in resolution of an image (not shown) of sample 412A formed at a detector (not shown) by a raster scan method from defocused electron beam 410B.

FIG. 6B depicts a simplified diagram illustrating a slightly defocused beam 410B (having rays 504D, 504E, 540F) passing through sample 412B to a position sensitive detector 416B. FIG. 6B shows the same geometry as FIG. 6A but uses position sensitive detector 416B located a predetermined distance behind sample 412B such that the spatial distribution of the electrons may be collected in the plane of detector 416B. FIG. 6B illustrates three different positions in the spatial distribution, which are labeled in FIG. 6B as 1, 2, and 3. Position 1 is centered on the axis of beam 410B (i.e., ray 504E), and it originates from the center of illuminate area 602 on sample 412B. However, position 2 originates from a position (i.e., ray 504F) on sample 412B that is shifted relative to the center of illuminated area 602. Position 3 also originates from a position (i.e., ray 504D) on sample 412B that is shifted relative to the center of illuminated area 602 but in a different direction than position 2 and by a different amount.

Although FIG. 6B shows, for ease of illustration, the spatial distribution in the plane of the sheet of paper on which the figure is drawn, the illustrated principles apply in directions normal to the plane of the illustration. In the plane of detector 416B, electrons with coordinates $(X_d, Y_d)$ are related to sample coordinates $(X_s, Y_s)$ according to the equation $(X_s, Y_s) = (D/(D+L))(X_d, Y_d)$, wherein subscript "s" stands for sample, subscript "d" stands for detector, and capital letter "D" shown as a non-subscript represents the defocus distance "D" from point 502 of electron beam 410B to sample 412B, and "L" is the distance from the sample to the detector. The defocus distance (D) can be either positive (i.e., electron beam 410B is focused in front of the sample 412B) or negative (i.e., electron beam 410B focused behind sample 412B).

The electron detector 416B acquires an N×M matrix of electron intensities, P(N,M), in the detector plane. Each detector pixel P(i,j), with $1 \leq i \leq N$ and $1 \leq j \leq M$, corresponds to specific sample coordinates $(X_s, Y_s)$. Due to defocus, astigmatism and spherical aberration, the relation between the detector pixel P(i,j) and sample coordinates $(X_s, Y_s)$ is not a priori known, but depends on defocus, astigmatism and spherical aberration in a straightforward mathematical manner. Thus, when defocus, astigmatism and spherical aberration are determined, the pixel intensity P(i,j) can be assigned to the corresponding sample position $(X_s, Y_s)$, and a corrected map $I(X_s, Y_s)$ of the image intensities can be constructed in the sample plane. This mapping is done for every pixel in the detector. If the position of the electron beam is changed relative to the sample (either by scanning the electron beam or by moving the sample), a new detector intensity map P(N,M) can be acquired for this new position, and a new intensity map $I(X_s, Y_s)$ can be constructed for the new position of the electron beam relative to the sample. The intensity maps $I(X_s, Y_s)$ for different electron beam or sample positions are spatially added to obtain a real space image of the entire sample. If the choice of defocus D is incorrect, the partial images added together will not properly overlap into a combined image, i.e., the overlapped regions of the partial images will be out of focus. By varying the defocus D, the combined image may be observed as a function of D, and the defocus D for which the overlapped regions of the partial images are in focus be determined. Thus, the image can be focused using software algorithms running on post-detection image processor 430 (shown in FIG. 4) that implement the disclosed post-detection image correction systems and methodologies after the dataset has been acquired. Focusing can be performed by a person who observes the image on a computer screen and adjusts defocus D interactively. Focusing may also be performed by a computer algorithm that uses a suitable numerical measure to determine the optimum defocus D.

To define a spherical coordinate system, one must choose two orthogonal directions (namely, the zenith and the azimuth reference) and an origin point in space. These choices determine a reference plane that contains the origin point and is perpendicular to the zenith. The spherical coordinates of a point are then defined as follows: the radius or radial distance is the Euclidean distance from the origin to the point; the inclination (or polar angle) is the angle between the zenith direction and the line segment defined by the origin and the point; and the he azimuth (or azimuthal angle) is the signed angle measured from the azimuth reference direction to the orthogonal projection of the line segment defined by the origin and the point on the reference plane.

In general, astigmatism occurs because the defocus distance D is not constant with the azimuthal angle. As a point of comparison, in light optical systems astigmatism can usually be eliminated by a careful design of the lens system. In electron microscopy, astigmatism is always present. A known configuration for addressing astigmatism is to provide special optical elements (e.g., stigmators) that must be adjusted by a microscope operator prior to image detection/acquisition. One or more embodiments of the present disclosure take advantage of the observation that, when astigmatism is present, it corresponds to a defocus D that depends on azimuth $\phi$, $d(\phi)$. Thus, application of the disclosed post-detection image correction systems and methodologies to correct both astigmatism and defocus is not significantly more computationally difficult than correcting defocus by itself.

An exemplary application of the disclosed post-detection image correction systems and methodologies to correct both astigmatism and defocus proceeds as follows. After acquiring the electron distributions in the detector plane for an "N" by "M" matrix of pixel positions, P(N,M), on sample 412B, detector 416B now has acquired a defocused and astigmatic image (e.g., uncorrected image 418 shown in FIG. 4) of sample 412B. Each detector pixel P(i,j), with 1<i<N and 1<j<M, corresponds to specific sample coordinates $(X_s,Y_s)$. Due to defocus, astigmatism and spherical aberration, the relation between the detector pixel P(i,j) and sample coordinates $(X_s,Y_s)$ is not a priori known, but depends on defocus, astigmatism and spherical aberration in a straightforward mathematical manner. Thus, when defocus, astigmatism and spherical aberration are determined, the pixel intensity P(i,j) can be assigned to the corresponding sample position $(X_s,Y_s)$, and a corrected map $I(X_s,Y_s)$ of the image intensities can be constructed in the sample plane. This mapping is done for every pixel in the detector. If the position of the electron beam is changed relative to the sample (either by scanning the electron beam or by moving the sample), a new detector intensity map P(N,M) can be acquired for this new position, and a new intensity map $I(X_s,Y_s)$ can be constructed for the new position of the electron beam relative to the sample. The intensity maps I $(X_s,Y_s)$ for different electron beam or sample positions are spatially added to obtain a real space image of the entire sample. Post-detection image processor 430 (shown in FIG. 4) now adjusts the defocused and astigmatic image. If the choice of defocus D and astigmatism d($\phi$) are incorrect, the partial images added together will not properly overlap into a combined image, i.e. the overlapped regions of the partial images will be out of focus and not properly stigmated. By varying the defocus D and astigmatism d($\phi$), the image can be observed as a function of defocus and d($\phi$), and the defocus and the azimuthally varying defocus d($\phi$) for which the image is in focus and stigmated can be determined. Thus, the image can be focused and stigmated using software algorithms running on post-detection image processor 430 (shown in FIG. 4) that implement the disclosed post-detection image correction systems and methodologies after the dataset has been acquired. Focusing and stigmating can be performed by a person who observes the image on a computer screen and adjusts defocus D and astigmatism d($\phi$) interactively. Focusing may also be performed by a computer algorithm that uses a suitable numerical measure to determine the optimum defocus D and astigmatism d($\phi$).

FIG. 7A depicts a simplified diagram illustrating the focusing of an electron beam 410C without spherical aberration, and FIG. 7B depicts a simplified diagram illustrating the focusing of an electron beam 410D with spherical aberration. In general, spherical aberration is an optical effect observed in an optical device (e.g., a lens, a mirror, etc.) that occurs due to the increased refraction of light rays when they strike a lens near its edge, in comparison with those that strike nearer the center. The increased refraction occurs when rays further away from the optical axis are focused too strongly. Thus, spherical aberration results in an imperfection of the produced image. All lenses suffer from spherical aberration. As shown in FIG. 7B, the intensity distribution of electron beam 410D at the sample position is blurred due to spherical aberration. The displacement of electron rays 504G, 504H, 504I, 504J, 504K at the sample due to spherical aberration is given by $C_s \cdot \theta^3$. If it is assumed that a given electron ray has angles $(\theta_x, \theta_y)$ relative to the optical axis, the ray will intersect sample 412C at position $(X_s, Y_s) = (C_s \cdot \theta_x^3, C_s \cdot \theta_y^3)$. In the detector plane, the position of this same ray is given by $(X_d, Y_d) = (X_s + L \cdot \theta_x, Y_s + L \cdot \theta_y)$. It is noted that, in the present example, the small angle approximation is used, wherein $\tan(\theta) = \sin(\theta) = \theta$.

An exemplary application of the disclosed post-detection image correction systems and methodologies to correct spherical aberration and astigmatism and defocus proceeds as follows. After acquiring the electron distributions in the detector plane for an "N" by "M" matrix of pixel positions, P(N,M) on sample 412B, detector 416B now has acquired a defocused and astigmatic image (e.g., uncorrected image 418 shown in FIG. 4) of sample 412B. Each detector pixel P(i,j), with 1<i<N and 1<j<M, corresponds to specific sample coordinates $(X_s,Y_s)$. Due to defocus, astigmatism and spherical aberration, the relation between the detector pixel P(i,j) and sample coordinates $(X_s,Y_s)$ is not a priori known, but depends on defocus, astigmatism and spherical aberration in a straightforward mathematical manner. Thus, when defocus, astigmatism and spherical aberration are determined, the pixel intensity P(i,j) can be assigned to the corresponding sample position $(X_s,Y_s)$, and a corrected map $I(X_s,Y_s)$ of the image intensities can be constructed in the sample plane. This mapping is done for every pixel in the detector. If the position of the electron beam is changed relative to the sample (either by scanning the electron beam or by moving the sample), a new detector intensity map P(N,M) can be acquired for this new position, and a new intensity map $I(X_s,Y_s)$ can be constructed for the new position of the electron beam relative to the sample. The intensity maps I $(X_s,Y_s)$ for different electron beam or sample positions are spatially added to obtain a real space image of the entire sample. Post-detection image processor 430 (shown in FIG. 4) now adjusts the uncorrected image which includes defocus, astigmatism, and spherical aberration. If the choice of spherical aberration, defocus, and astigmatism is incorrect, the partial images added together will not properly overlap into a combined image, i.e. the overlapped regions of the partial images will be out of focus, astigmatic, and radially distorted. By varying the spherical aberration coefficient $C_s$, defocus, and astigmatism the image can observed as a function of $C_s$, defocus, and astigmatism and the values of $C_s$, defocus, and astigmatism for which the image is sharpest can be determined. Thus, the spherical aberration coefficient $C_s$, defocus, and astigmatism in uncorrected image 418 (shown in FIG. 4) can be corrected using software algorithms running on post-detection image processor 430 (shown in FIG. 4) that implement the disclosed post-detection image correction systems and methodologies after the dataset has been acquired. Correction of $C_s$, defocus, and astigmatism can be performed by a person who observes the image on a computer screen and adjusts $C_s$, defocus, and astigmatism interactively. Correction of $C_s$, defocus, and astigmatism can also be performed by a computer algorithm that uses a suitable numerical measure to determine the value of Cs, defocus, and astigmatism.

Figure 8:
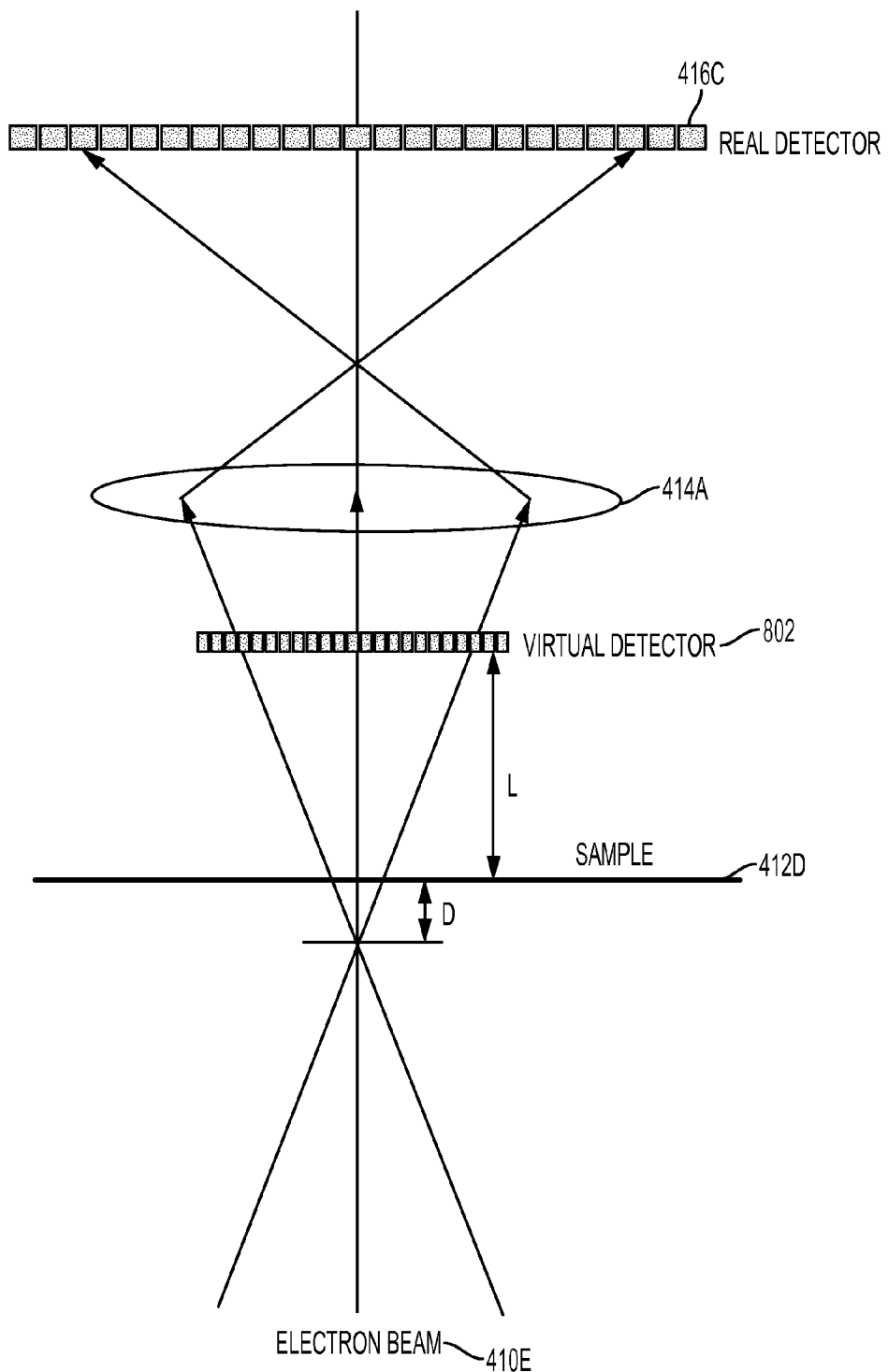
FIG. 8 depicts a simplified diagram illustrating a slightly defocused beam using a single integrating detector, wherein a spatial electron distribution (i.e., virtual detector) is positioned between the sample and the single integrating detector according to one or more embodiments.

FIG. 8 depicts a simplified diagram illustrating a slightly defocused electron beam 410E using a position sensitive detector 416C, wherein a spatial electron distribution (i.e., virtual detector 802) is positioned between sample 412D and integrating detector 416C according to one or more embodiments. Detector 416C does not have to be located immediately behind sample 412D. The plane in which it is desirable to observe the spatial electron distribution (i.e., virtual detector 802) can be transferred to the physical location of the detector plane (real detector 416C) by a suitable electrostatic or magnetic transfer lens 414A, or a plurality of such lenses as may be suitable. The magnification from virtual detector 802 to real detector 416C need not be equal to one, but can for example, be greater than one as shown in FIG. 8.

Defocus, astigmatism, and spherical aberration do not need to be constant during detection of the image. In particular, it is not uncommon for defocus and astigmatism to drift during a lengthy data detection, or the sample itself may not be perfectly flat such that defocus changes as a function of sample position. Accordingly, post-detection image processor 430 may include functionality that allows these variables to be functions of time, as well as position $(X_s, Y_s)$, in order to obtain a corrected image with optimum resolution across the full field of view. While taking into account time can make image correction more complex, suitable algorithms may be designed that incorporate such time and position-dependent corrections. Although such time and position-dependent corrections can be implemented interactively by a person, use of a suitable computer algorithm that monitors the image resolution as a function of place and time may also be implemented.

Figure 9:
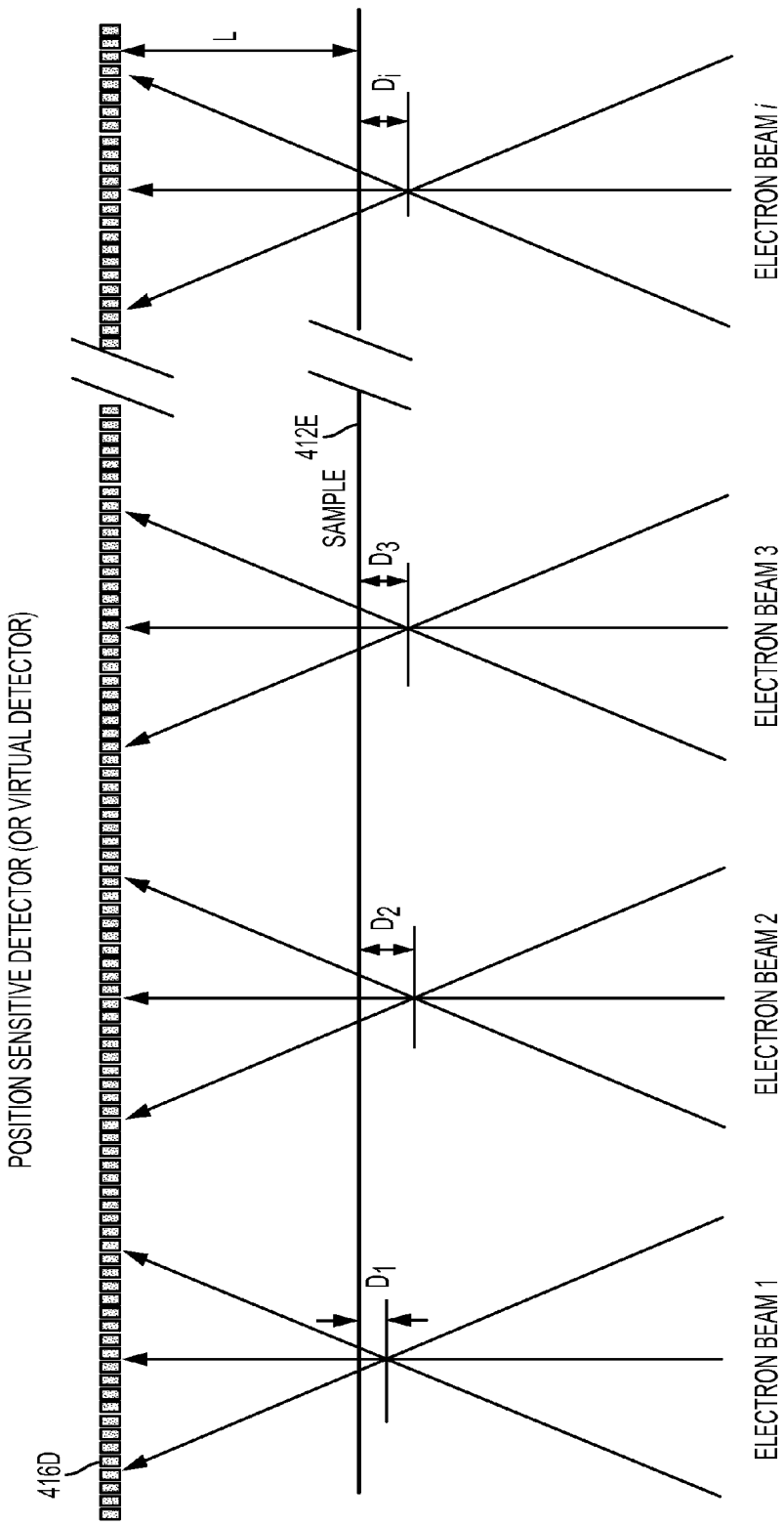
FIG. 9 depicts a simplified diagram illustrating a multiple electron beam configuration according to one or more embodiments.

FIG. 9 depicts a simplified diagram illustrating a configuration according to one or more embodiments, wherein electron beam 410 (shown in FIG. 4) is implemented as multiple electron beams (1, 2, 3, ... i). The different electron beams (1 to i) are shown with different defocus values $D_i$. A large position sensitive detector 416D (for instance a suitable 5 k×5 k imaging electron detector) detects the distributions of the electron intensities for each of the electron beams (1, 2, 3, ... i) in both the X direction and the Y direction. Each electron beam illuminates a roughly circular area on imaging detector 416D. Care is taken to ensure that the intensity distributions of neighboring electron beams do not overlap, yet are sufficiently close to make optimum use of the imaging detector. After detection of the multi-beam intensity distributions, all electrons beams (1, 2, 3, ... i) are advanced to a next position on sample 412E, either by scanning all the electron beams in unison, or by translating sample 412E. In this manner, an "N" by "M" (N×M) matrix data set is acquired for each electron beam to form an N×M image for each electron beam. If there are a total of U×V electron beams (U in the X-direction, V in the Y-direction) a total of U×V detector images are acquired, wherein each detector image includes an N×M intensity distribution. For each electron beam (1, 2, 3, ... i), defocus, astigmatism, and spherical aberration in an uncorrected image (e.g., uncorrected image 418 shown in FIG. 4) formed from the electron beams is corrected post-detection by post-detection image processor 430 (shown in FIG. 4). After correction of each of the U×V sub-images (each formed by one electron beam) the final image is assembled from the corrected images.

FIG. 10 depicts equations that may be used in reconstruction of the object plane (i.e., correcting an uncorrected, acquired image for defocus, astigmatism and spherical aberration) according to one or more embodiments of the present disclosure. It is assumed that an electron ray makes an angle with the Z-axis (with the electron beam traveling in the positive Z direction). In general, ray displacements in the X direction and the Y direction with angle $(v_x, v_y)$, compared to the ray with zero angles, are given by Equation (1), wherein $C_{10}$ is defocus, $C_{12a}$ and $C_{12b}$ are astigmatism (in two planes rotated by 45 degrees), and $C_{30}$ is spherical aberration (also denoted as $C_s$ herein). Equation (1) is a known in the electron microscopy art. In the detector plane, wherein d is defocus and 1 is a distance from the sample to the detector, Equation (2) is utilized. In the object (sample) plane, Equation (3) is utilized.

For a given object, and for constants d, 1, $C_{12a}$, $C_{12b}$, $C_{30}=C_s$, a pixel P(i,j) is selected from the uncorrected detector intensity map P(N,M) with 1≤i≤N and 1≤j≤M. For this pixel P(i,j) the detector position $(S_x^D, S_y^D)$ is known from the detector pixel geometry. Now, using Equation (2) with initial estimated values for defocus d, astigmatism parameters $C_{12a}$ and $C_{12b}$, and spherical aberration $C_{30}=C_s$, $\theta_x$ and $\theta_y$ can be solved. Next, the initial values for d, $C_{12a}$ and $C_{12b}$, $C_{30}=C_s$, and $\theta_x$ and $\theta_y$ are entered into Equation (3), and the sample coordinates $(S_x^O, S_y^O)$ corresponding to detector pixel element P(i,j) are obtained. To take into account finite source size, small random offsets $(\delta_x^s, \delta_y^s)$ to $(S_x^O, S_y^O)$ and $(S_x^D, S_y^D)$ may be added according to the lateral extent of the de-magnified source (for example, Gaussian). For each detector pixel, the average value of $(S_x^D, S_y^D)$ is known, with an accuracy limited by the size of the pixel. The intensity of the ray (as read from the detector, i.e. the value of the matrix pixel element P(i,j)) is then assigned to the object plane at coordinates $(S_x^O, S_y^O)$. This process is repeated for each pixel P(i,j) with 1≤i≤N and 1≤j≤M within the P(N,M) matrix. The back-transformed intensity distribution in the object plane for the estimated values of d, $C_{12a}$, $C_{12b}$, $C_{30}=C_s$ is now known. This procedure is repeated for the next beam position until all beam positions have been covered. All back-transformed intensity distributions in the object plane are added to obtain the back-transformed image.

With overlap between consecutive beam positions, the reconstructed object planes must give identical results in the overlapped regions, provided that the correct values for d, $C_{12a}$, $C_{12b}$, $C_{30}=C_s$ have been estimated. If these estimated values are incorrect, there will still be defects and distortions in the reconstructed object plane, and a new estimate must be entered. The distortions in the reconstructed object plane can then be iteratively reduced until the differences in the overlapped regions are minimized. In a multi-beam configuration of the present disclosure, this process is applied to each of the beams.

Figure 11:
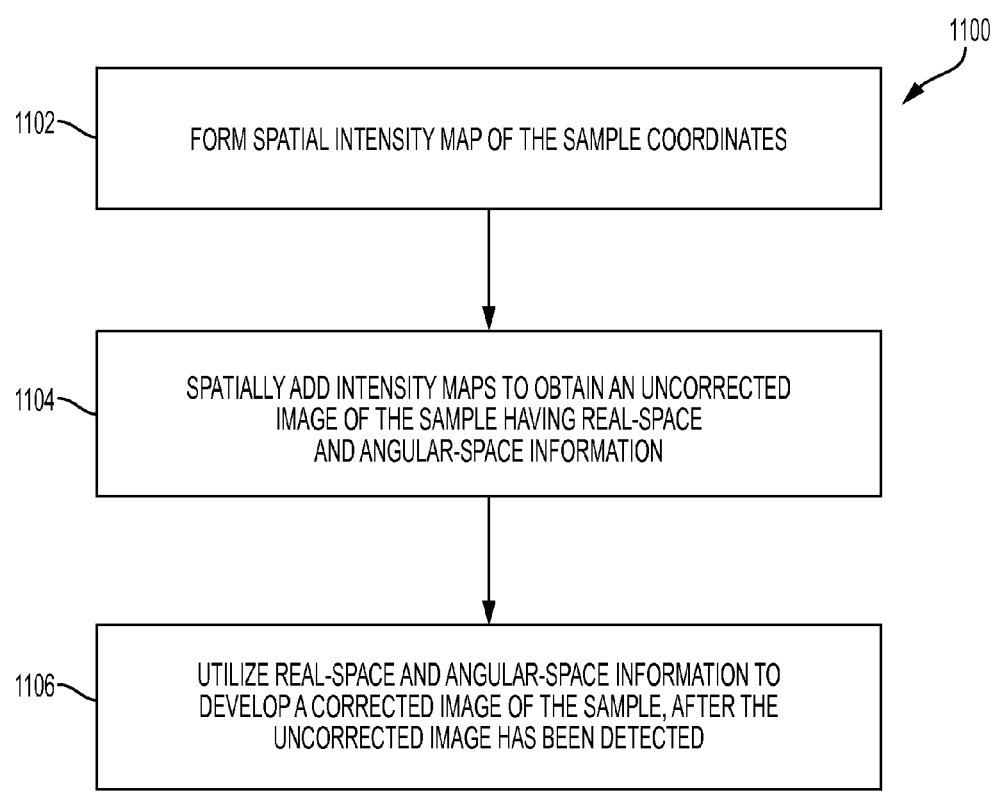
FIG. 11 depicts a flow diagram illustrating a methodology according to one or more embodiments.

FIG. 11 depicts a flow diagram illustrating a methodology 1100 according to one or more embodiments. In general, the electron beam will not be exactly focused in the sample plane. In addition, there will be astigmatism and spherical aberration present. Methodology 1100 may be applied to correct all three defects (defocus, astigmatism, and spherical aberration) after detection of the data that forms the uncorrected image. Methodology 1100 begins at block 1102 by forming a spatial intensity map of the sample coordinates for a given choice of defocus, astigmatism d($\phi$) and spherical aberration coefficient $C_s$. At block 1104 the intensity maps are spatially added to obtain an uncorrected image of the sample having real-space and angular-space information. If the choice of defocus, astigmatism d($\phi$) and spherical aberration coefficient $C_s$ is incorrect, the image will be blurred. By varying defocus and astigmatism d($\phi$) and the spherical aberration coefficient $C_s$, the image can be observed as a function of d($\phi$) and $C_s$, and the values of d($\phi$) and $C_s$ for which the image is sharpest may be determined. Thus, block 1106 utilizes real-space and angular-space information of the detected, uncorrected image to develop a corrected image of the sample based at least in part on processing the real-space and angular-space information of the detected, uncorrected image. Correction of defocus, astigmatism d($\phi$) and spherical aberration coefficient $C_s$ can be performed by a person who observes the image on a computer screen and adjusts defocus, astigmatism d($\phi$) and spherical aberration coefficient $C_s$ interactively. Correction of defocus, astigmatism d($\phi$) and spherical aberration coefficient $C_s$ can be performed by a computer algorithm that uses a suitable numerical measure to determine the values of defocus and astigmatism d($\phi$) and spherical aberration coefficient $C_s$.

Thus, it can be seen from the foregoing description and illustrations that one or more embodiments of the present disclosure provide technical features and benefits. The systems and methodologies of the present disclosure may be particularly suitable for, but not limited to, acquiring images with spatial resolution as small as a few nanometers of biological tissue samples or other nano-structured organic or inorganic samples, including samples of semiconductor circuits. The systems and methodologies of the present disclosure may also be applied to light-microscopy, wherein the optical system contains significant defocus and/or astigmatism and/or spherical aberration. Because the system acquires, for each pixel in the image, a 2D image of the detector intensity distribution, very large datasets are acquired. These datasets may be stored on the detection computer system, wherein the post-detection corrections may also be performed. Alternatively, the datasets may be transferred to another computer system or data server, and the post-detection corrections may be performed later, possibly at a different location, and a different computing system. The correction may be performed in a cloud computing system (e.g., cloud 50 shown in FIGS. 2 and 4), and the corrected image may be returned to the original creator of the image, or may be stored in the cloud computing system, or may be delivered to another party. Large numbers of corrected images may be combined to form 3D composite images of complex 3D structure, such as (but not limited to) nano-scale materials and devices, or biological tissues.

Additionally, the use of multiple parallel beams in the present disclosure greatly reduces total image detection/acquisition time. For example, if a 16×16 beam array (256 electron beams) is used, the detection time would reduce by a factor 256, provided that the electron current in each electron beam is the same as the electron current that can be realized in a single electron beam. If the desired field of view is 1×1 millimeter$^2$, the electron beams would be spaced by 1000/16=62.5 micrometers in both the X direction and the Y direction. The electron beams can be packed in various manners, including but not limited to square or hexagonal arrays. A multi-beam electron source can be fabricated on a monolithic chip using standard IC (integrated circuit) and MEMS (micro-electromechanical system) micro-fabrication techniques. The electron source to sample distance may be kept at a minimum (e.g., 1-5 cm) without beam crossovers between source and sample to minimize space charge effects. However, other embodiments are also possible and are not precluded herein. Following the teachings of the present disclosure, the electron beams may be, but do not have to be focused or stigmated individually. Defocus and astigmatism for each beam are corrected after data detection is complete. With an 8 k×8 k imaging detector, electron beam arrays up to 32×32 (with about 250×250 pixels available for each beam to measure the intensity distribution in the detector plane) are feasible. Accordingly, the operation of a computer system implementing one or more of the disclosed embodiments can be improved.

Figure 12:
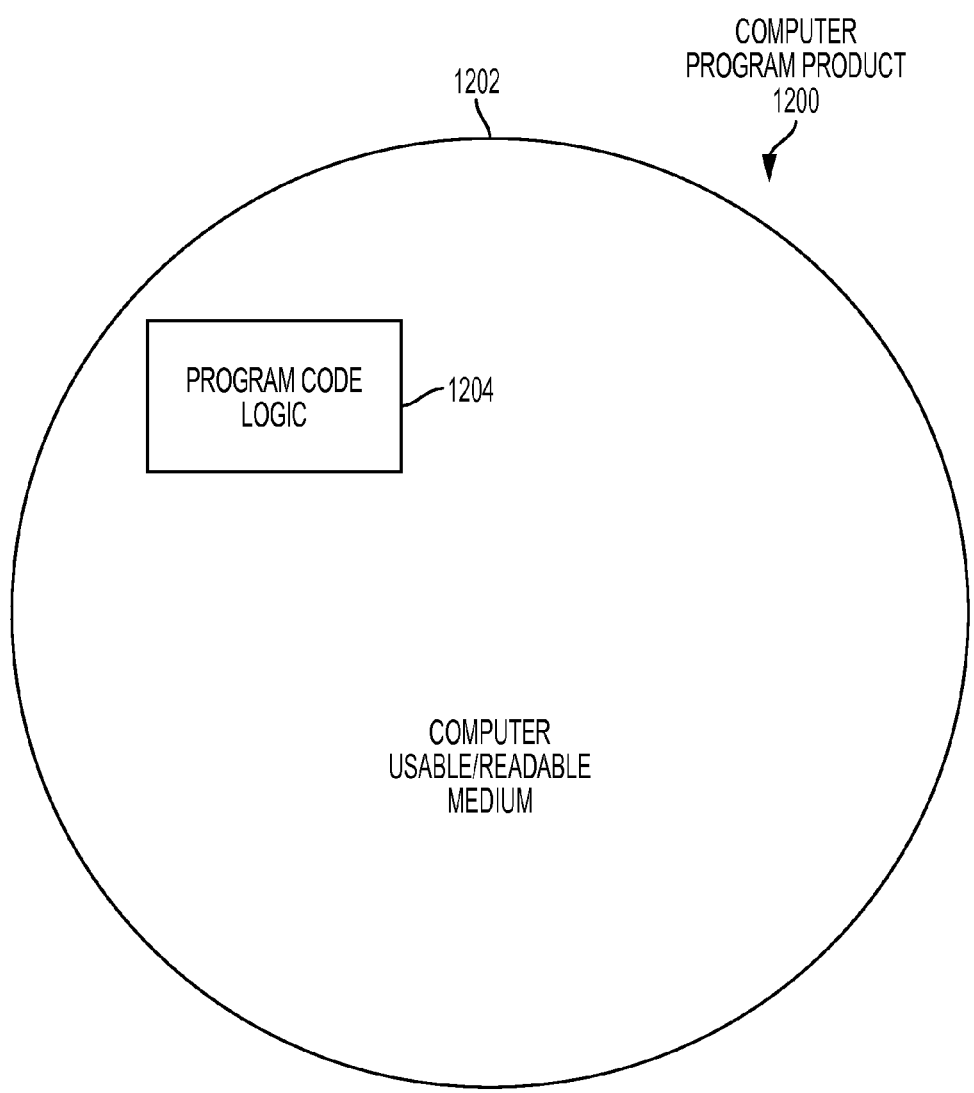
FIG. 12 depicts a computer program product in accordance with one or more embodiments.

Referring now to FIG. 12, a computer program product 1200 in accordance with an embodiment that includes a computer readable storage medium 1202 and program instructions 1204 is generally shown.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

It will be understood that those skilled in the art, both now and in the future, may make various improvements and enhancements which fall within the scope of the claims which follow.

What is claimed is:

1. An information processing system far generating image data of a sample, the information processing system comprising:
   a detector system;
   a memory communicatively coupled to the detector system; and
   a post-detection image processor communicatively coupled to the memory and the detector system;
   wherein the detector system is configured to receive particles from the sample and, based at least in part on receiving the particles, generate uncorrected image data corresponding to the particles, wherein at least a portion of the uncorrected image data represents defocus of an image of the sample;
   wherein the post-detection image processor is configured to generate corrected image data by processing the uncorrected image data to remove the effects of the portion of the uncorrected image data that represents defocus of the image.

2. The information processing system of claim 1, wherein the post-detection image processor comprises a node of a cloud computing system.

3. A computer program product for generating image data of a sample, the computer program product comprising:
   a non-transitory computer readable storage medium having program instructions embodied therewith, the program instructions being readable by at least one processor circuit to cause the at least one processor circuit to perform a method comprising:
   accessing from a memory uncorrected image data corresponding to particles received at a detector system, wherein at least a portion of the uncorrected image data represents defocus, astigmatism or spherical aberration of an image of the sample;
   generating corrected image data by processing the uncorrected image data to remove the effects of the portion of the uncorrected image data that represents defocus, astigmatism or spherical aberration of the image.

4. The computer program product of claim 3, wherein processing the uncorrected image data to remove the effects of the portion of the uncorrected image data that represents defocus, astigmatism or spherical aberration of the image comprises:
  determining a defocus, astigmatism or spherical aberration of the sample; and
  utilizing the determined defocus, astigmatism or spherical aberration of the sample to determine relationships between the uncorrected image data and coordinates of the sample.

5. The computer program product of claim 4, wherein processing the uncorrected image data to remove the effects of the portion of the uncorrected image data that represents defocus, astigmatism or spherical aberration of the image further comprises:
  utilizing the determined relationships between the uncorrected image data and coordinates of the sample to generate corrected image data that represent intensities of the particles.

6. The computer program product of claim 5, wherein processing the uncorrected image data to remove the effects of the portion of the uncorrected image data that represents defocus, astigmatism or spherical aberration of the image further comprises:
  assigning coordinates of the sample to the corrected image data that represents the intensities of the particles.

7. The computer program product of claim 6, wherein processing the uncorrected image data to remove the effects of the portion of the uncorrected image data that represents defocus, astigmatism or spherical aberration of the image further comprises:
  determining another defocus, astigmatism or spherical aberration of the sample;
  utilizing the determined another defocus, astigmatism or spherical aberration of the sample to determine another set of relationships between the uncorrected image data and coordinates of the sample;
  utilizing the determined another set of relationships between the uncorrected image data and coordinates of the sample to generate another set of corrected image data that represents the intensities of the particles; and
  assigning coordinates of the sample to the another set of corrected image data that represents the intensities of the particles.

8. An information processing system for generating image data of a sample, the information processing system comprising:
  a detector having a two-dimensional collection surface;
  a memory communicatively coupled to the detector system; and
  a post-detection image processor communicatively coupled to the memory and the detector system;
  wherein the detector system is configured to receive at the two-dimensional collection surface particles from the sample and, based at least in part on receiving the particles, generate uncorrected image data corresponding to the particles, wherein at least a portion of the uncorrected image data represents defocus, astigmatism or spherical aberration of an image of the sample;
  wherein the memory is configured to store the uncorrected image data, which includes storing the portion of the uncorrected image data that represents defocus, astigmatism or spherical aberration of the image of the sample;
  wherein the post-detection image processor is configured to access the stored uncorrected image data, which includes accessing the stored portion of the uncorrected image data that represents defocus, astigmatism or spherical aberration of the image of the sample;
  wherein the post-detection image processor is further configured to generate corrected image data by processing the uncorrected image data to remove the effects of the portion of the uncorrected image data that represents defocus, astigmatism or spherical aberration of the image.

9. The information processing system of claim 8, wherein the detector system is configured to generate the uncorrected image data by:
  measuring intensities of the received particles; and
  generating data that represents the intensities of the received particles, wherein the uncorrected image data comprises the data that represents the intensities of the received particles.

10. The information processing system of claim 9, wherein processing the uncorrected image data to remove the effects of the portion of the uncorrected image data that represents defocus, astigmatism or spherical aberration of the image comprises:
  determining a defocus, astigmatism or spherical aberration of the sample; and
  utilizing the determined defocus, astigmatism or spherical aberration of the sample to determine relationships between the data that represents the intensities of the received particles and coordinates of the sample.

11. The information processing system of claim 10, wherein processing the uncorrected image data to remove the effects of the portion of the uncorrected image data that represents defocus, astigmatism or spherical aberration of the image further comprises:
  utilizing the determined relationships between the data that represents the intensities of the received particles and coordinates of the sample to generate corrected data that represents the intensities of the received particles.

12. The information processing system of claim 11, wherein processing the uncorrected image data to remove the effects of the portion of the uncorrected image data that represents defocus, astigmatism or spherical aberration of the image further comprises:
  assigning coordinates of the sample to the corrected data that represents the intensities of the received particles.

13. The information processing system of claim 12, wherein processing the uncorrected image data to remove the effects of the portion of the uncorrected image data that represents defocus, astigmatism or spherical aberration of the image further comprises:
  determining another defocus, astigmatism or spherical aberration of the sample;
  utilizing the determined another defocus, astigmatism or spherical aberration of the sample to determine another set of relationships between the data that represents the intensities of the received particles and coordinates of the sample;
  utilizing the determined another set of relationships between the data that represents the intensities of the received particles and coordinates of the sample to generate another set of corrected data that represents the intensities of the received particles; and
  assigning coordinates of the sample to the another set of corrected data that represents the intensities of the received particles.

* * * * *